(12) United States Patent
Oberhauser et al.

(10) Patent No.: US 10,491,212 B2
(45) Date of Patent: Nov. 26, 2019

(54) APPARATUS TO SECURE A SENSOR ASSEMBLY FOR A DEVICE TOUCH BUTTON

(71) Applicant: TEXAS INSTRUMENTS INCORPORATED, Dallas, TX (US)

(72) Inventors: Christopher Oberhauser, San Jose, CA (US); Dongtai Liu, Fremont, CA (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 8 days.

(21) Appl. No.: 15/620,810

(22) Filed: Jun. 12, 2017

(65) Prior Publication Data

US 2017/0359063 A1 Dec. 14, 2017

Related U.S. Application Data

(60) Provisional application No. 62/348,933, filed on Jun. 11, 2016.

(51) Int. Cl.
| | |
|---|---|
| *H03K 17/96* | (2006.01) |
| *H04M 1/23* | (2006.01) |
| *H04M 1/18* | (2006.01) |
| *H03K 17/972* | (2006.01) |
| *H03K 17/98* | (2006.01) |

(52) U.S. Cl.
CPC .......... *H03K 17/962* (2013.01); *H04M 1/185* (2013.01); *H04M 1/236* (2013.01); *H01H 2239/074* (2013.01); *H03K 17/9622* (2013.01); *H03K 17/972* (2013.01); *H03K 17/98* (2013.01); *H03K 2217/96038* (2013.01); *H03K 2217/960755* (2013.01); *H04M 2250/22* (2013.01)

(58) Field of Classification Search
CPC .... H03K 17/962; H03K 2217/960755; H04M 1/236; H04M 2250/22; H01H 2239/074
USPC .......................................................... 307/116
See application file for complete search history.

(56) References Cited

U.S. PATENT DOCUMENTS

2017/0285848 A1* 10/2017 Rosenberg ............ G06F 3/0202

\* cited by examiner

*Primary Examiner* — Carlos Amaya
(74) *Attorney, Agent, or Firm* — Andrew Viger; Charles A. Brill; Frank D. Cimino

(57) ABSTRACT

An apparatus to secure a sensor assembly for a device touch button (such as for a mobile communications device). A touch sensor slot forms a part of the device case interior at a back-side of the touch button surface, and is configured to position the touch sensor (such as a sense coil inductor) relative to the associated touch button. A touch sensor spring clip is inserted within the touch sensor slot to flexibly urge the touch sensor toward the front-side surface of the touch sensor slot (back-side of the touch button surface). The touch sensor can include front-side spacers to maintain a sensing gap between the touch sensor and the touch button surface, and can include a sensor stiffener at the back-side surface of the touch sensor assembly, the touch sensor spring clip contacting the sensor stiffener. The touch sensor assembly can comprise a flex circuit PCB assembly.

15 Claims, 4 Drawing Sheets

APPARATUS TO SECURE A SENSOR ASSEMBLY FOR A DEVICE TOUCH BUTTON

CROSS-REFERENCE TO RELATED APPLICATIONS

Priority is claimed under 37 CFR 1.78 and 35 USC 119(e) to U.S. Provisional Application 62/348,933, filed 11 Jun. 2016), which is incorporated by reference.

BACKGROUND

Technical Field

This Patent Disclosure relates to touch input structures, such as touch buttons or keys, such as for use in personal computing/communication devices.

Related Art

Mobile/portable personal communications/computing devices commonly include physical/mechanical buttons integrated into a device case (such as on a side-wall edge). Such mechanical touch buttons are distinguished from, for example, capacitive touch buttons defined on a device screen.

Touch sensing technology can be used to replace these physical/mechanical buttons. Touch sensing can be used to detect touch-press of a touch button defined on a touch button surface, such as based on touch surface deflection/deformation. Touch sensing can be based on inductive sensing with an inductor coil sensor, or capacitive sensing with a capacitive electrode, disposed within the device case at the back-side of the touch button surface.

While this Background information references touch input for mobile/personal communication/computing devices, this Patent Disclosure is more generally directed to input button/keys based on touch technology.

BRIEF SUMMARY

This Brief Summary is provided as a general introduction to the Disclosure provided by the Detailed Description and Drawings, summarizing aspects and features of the Disclosure. It is not a complete overview of the Disclosure, and should not be interpreted as identifying key elements or features of, or otherwise characterizing or delimiting the scope of, the disclosed invention.

The Disclosure describes apparatus and methods for securing a sensor assembly for a device touch button, such as can be used in a mobile communications device.

According to aspects of the Disclosure, the apparatus can be used in a device with one or more touch buttons each defined on a touch button surface of the device. The apparatus can include a touch sensor slot, and a touch sensor spring clip for securing a touch sensor assembly within the touch sensor slot. The touch sensor assembly can include a touch sensor portion (such as a sense inductor coil). The touch sensor slot can form a part of the device case interior, at a back-side of the touch button surface, which forms a front-side surface of the touch sensor slot, and can be configured to position the touch sensor portion of the touch sensor assembly relative to the associated touch button. The touch sensor spring clip can be inserted within the touch sensor slot to flexibly urge the touch sensor portion toward the front-side surface of the touch sensor slot.

Other aspects and features of the invention claimed in this Patent Document will be apparent to those skilled in the art from the following Disclosure.

DETAILED DESCRIPTION

This Description and the Drawings constitute a Disclosure for apparatus and methods for securing a sensor assembly for a device touch button, such as for a mobile communications device, including describing examples, and illustrating various technical features and advantages.

Input/Control buttons for a mobile communications device (smart phone) can be implemented using touch sensing technology, such as with inductive or capacitive sensing. For an example implementation using inductive sensing technology, this involves installing/securing a Touch sensor assembly (including sensor inductor coils) inside the device case, for example along the case edge (see, for example, FIGS. 1A/1B).

The touch button apparatus according to this Disclosure addresses the problem of securing a Touch sensor assembly inside a device case by means that avoids the use of glue.

The touch button apparatus is Disclosed in the context of an example implementation for a mobile communications device. The example mobile communications device includes touch control/input buttons defined by a touch button surface integrated into the case of the mobile communications device (for example, into an edge portion of the case). The example touch button apparatus includes (a) a touch sensor assembly including a Touch sensor (for example, a sensor inductor coil for inductive sensing); (b) a Touch sensor slot machined as part of the case interior, located behind the Touch button surface, to receive and position the touch sensor assembly relative to the Touch button surface, and (c) a touch sensor spring clip to secure the Touch sensor assembly within the Touch sensor slot, juxtaposed with the Touch button surface.

In brief overview, a touch button apparatus according to this Disclosure can be used to secure a sensor assembly for a device touch button. A touch sensor slot forms a part of the device case interior at a back-side of the touch button surface, and is configured to position the touch sensor (such as a sense coil inductor) relative to the associated touch button. A touch sensor spring clip is inserted within the touch sensor slot to flexibly urge the touch sensor toward the front-side surface of the touch sensor slot (back-side of the touch button surface). The touch sensor can include front-side spacers to maintain a sensing gap between the touch sensor and the touch button surface, and can include a sensor stiffener at the back-side surface of the touch sensor assembly, the touch sensor spring clip contacting the sensor stiffener. The touch sensor assembly can comprise a flex circuit PCB assembly.

Figure 1A:
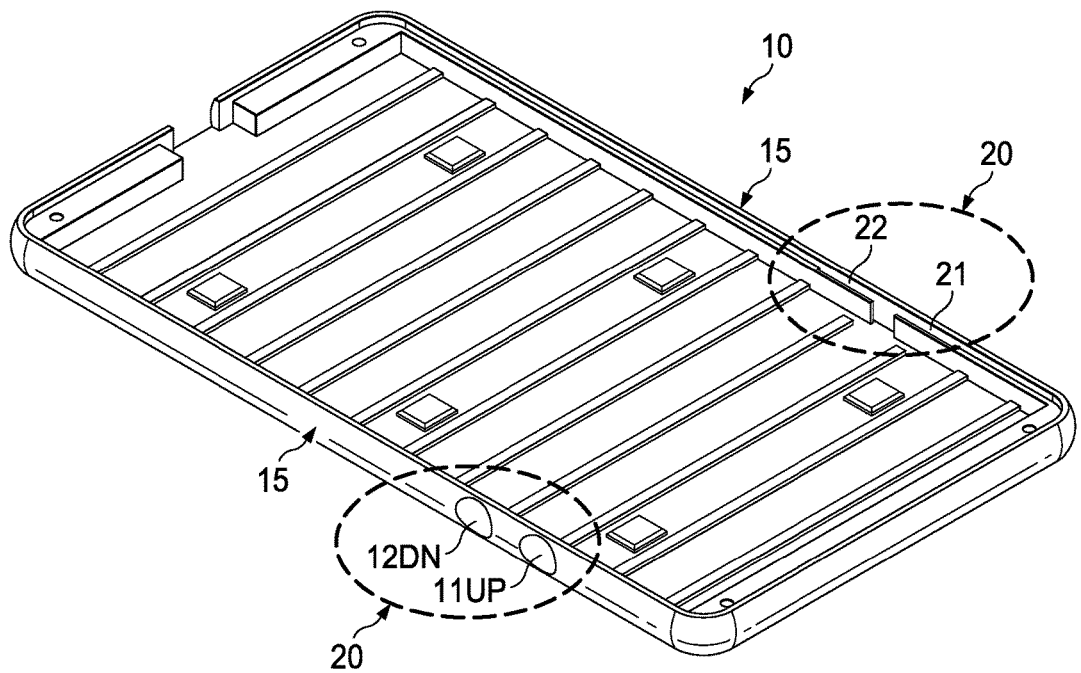
FIGS. 1A and 1B illustrate an example mobile communications device case [10] adapted for a touch button apparatus according to this Disclosure, including dual front-side touch buttons [11UP, 12DN], with dual back-side touch sensor slots [20, 21, 22], integrated (machined) into the case edge [15], for installing/securing a dual touch-button sensor assembly (see, FIGS. 2A/2B).
Figure 1B:
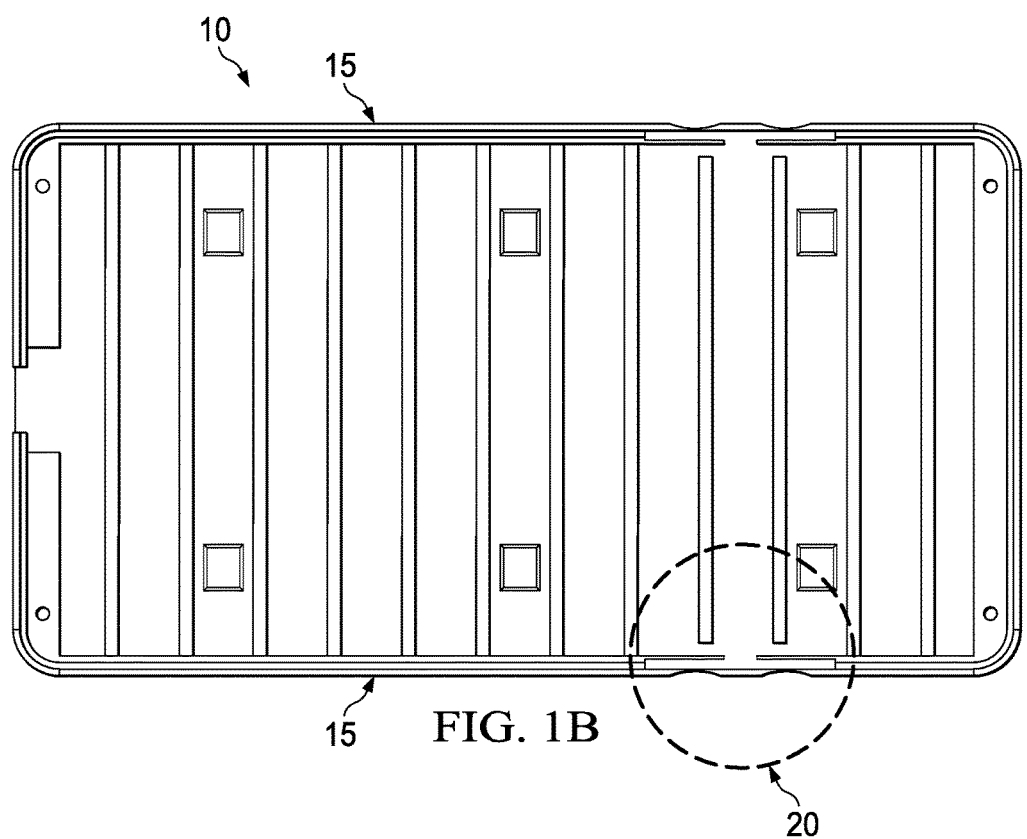

FIGS. 1A and 1B illustrate an example mobile communications device case 10 adapted for a touch button apparatus according to this Disclosure. The device includes dual front-side touch buttons 11UP, 12DN (such as volume up/dn), with dual back-side touch sensor slots 20 (21, 22), integrated (machined) into the case edge 15.

FIGS. 1A/1B illustrate an example mobile communications device case adapted for a touch button apparatus according to this Disclosure. The case includes dual touch edge buttons defined by a touch button surface. Dual-button touch sensor slots are integrated (machined) into the case edge behind the touch button surface.

Figure 2A:
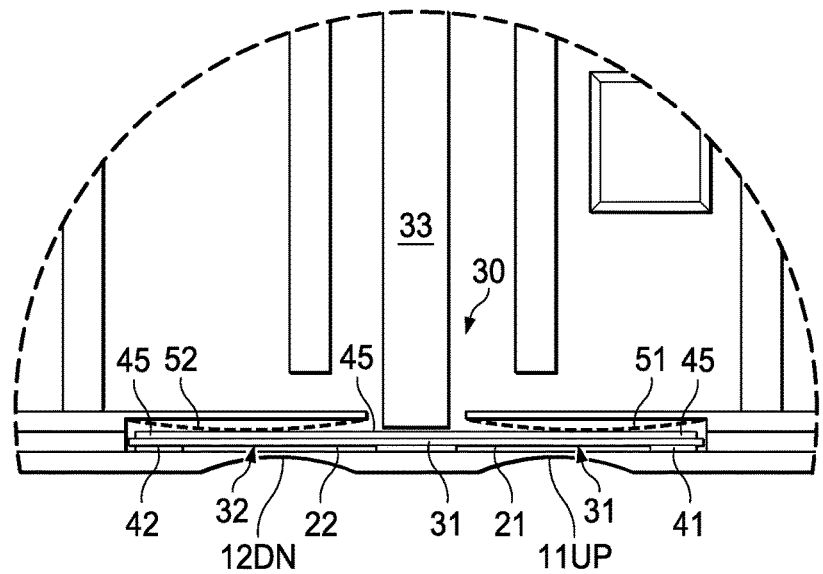
FIGS. 2A and 2B illustrate detail views of the example touch button apparatus according to this Disclosure, for dual touch buttons [11UP, 12DN], with dual back-side touch sensor slots [21, 22] for installing/securing a dual-configuration touch-button sensor assembly [31, 32] (such as dual sensor inductor coils) within the dual touch sensor slots with respective sensor spring clips [51, 52].
Figure 2B:
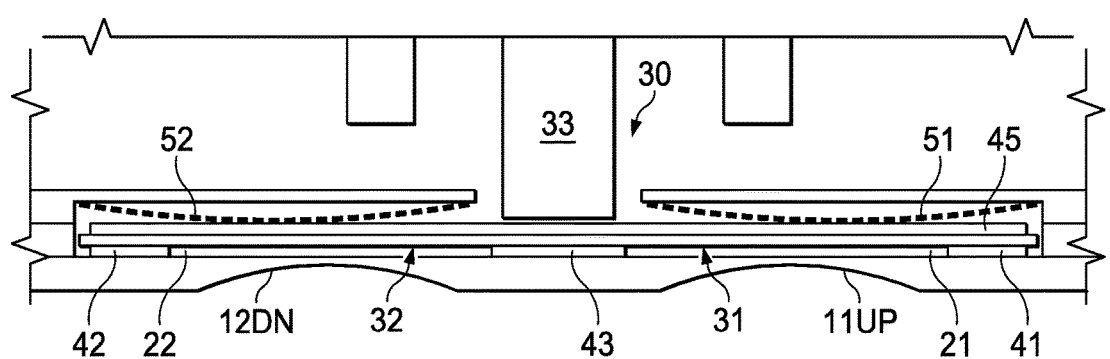

FIGS. 2A and 2B illustrate detail views of the example touch button apparatus according to this Disclosure. The example touch button apparatus includes dual touch buttons 11UP, 12DN.

Dual back-side touch sensor slots 21, 22 are configured for receiving a dual-configuration touch-button sensor assembly 31, 32, such as dual sensor inductor coils, within the dual touch sensor slots. The dual touch button assembly (dual touch assembly portions) are secured within respective dual touch sensor slots 21, 22, with respective sensor spring clips 51, 52.

The detail illustrates example touch button apparatus, including dual touch sensor slots machined/integrated into the case edge behind the touch button surface. Touch dual-sensor assemblies are inserted into the dual touch sensor slots, and secured with respective functionally illustrated touch sensor spring clips according to this Disclosure.

The example touch sensor assembly includes dual sensor assemblies, each including a sensor coil with a stiffener attached to the back of a sensor coil, and spacers attached to the front face of each sensor coil. The spacers maintaining a gap to permit touch deflection of the touch surface toward the sensor coil.

Figure 3:
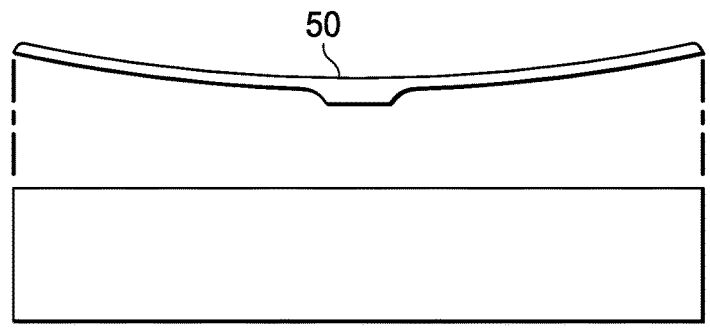
FIG. 3 illustrates an example touch sensor spring clip [50] for use in securing a touch-button sensor assembly (such as a sensor inductor coil PCBA (printed circuit board assembly) within a touch sensor slot according to this Disclosure.

FIG. 3 illustrates an example touch sensor spring clip 50 for use in securing a touch-button sensor assembly (such as a sensor inductor coil PCBA (printed circuit board assembly) within a touch sensor slot according to this Disclosure.

The touch sensor spring clips secure the touch sensor assembly within the touch sensor slot. A touch sensor spring clip is inserted into each touch sensor slot at the back side of the touch sensor assembly, exerting a force on the back of the touch sensor assembly, against the sensor stiffener, pressing the touch sensor assembly against the internal wall of the touch button surface, with sensor coil spacing maintained by the sensor spacers.

According to aspects of this Disclosure, the touch sensor spring clips function to secure a touch sensor assembly within a touch sensor slot, juxtaposing the sensor coil relative to the touch button surface.

The touch spring clip can be metallic or plastic material. The use of touch sensor spring clips according to this Disclosure avoids the use of glue, or other attachment means such as screws.

Figure 4:
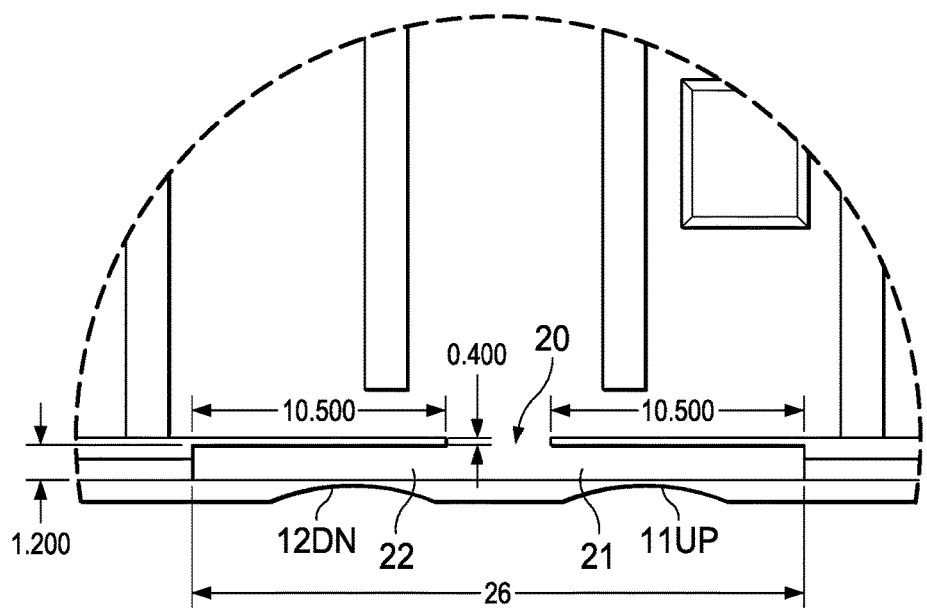
FIG. 4 illustrates a design example for a dual touch button arrangement, with dual touch buttons [11UP, 12DN], and a dual back-side touch sensor slots [20, 21, 22] according to this Disclosure, including example dimensioning.

FIG. 4 illustrates a design example for a dual touch button arrangement, with dual touch buttons 11UP, 12DN, and a dual back-side touch sensor slots 20 (21, 22) according to this Disclosure. For the design example, FIG. 4 includes example dimensioning.

FIG. 4 illustrates a design example, including dimensioning, of a mobile communications device case as in FIGS. 1A/1B. The case includes dual touch edge buttons defined by a touch button surface. The touch button apparatus includes dual touch sensor slots machined as part of the case at the interior of the touch edge surface.

Figure 5:
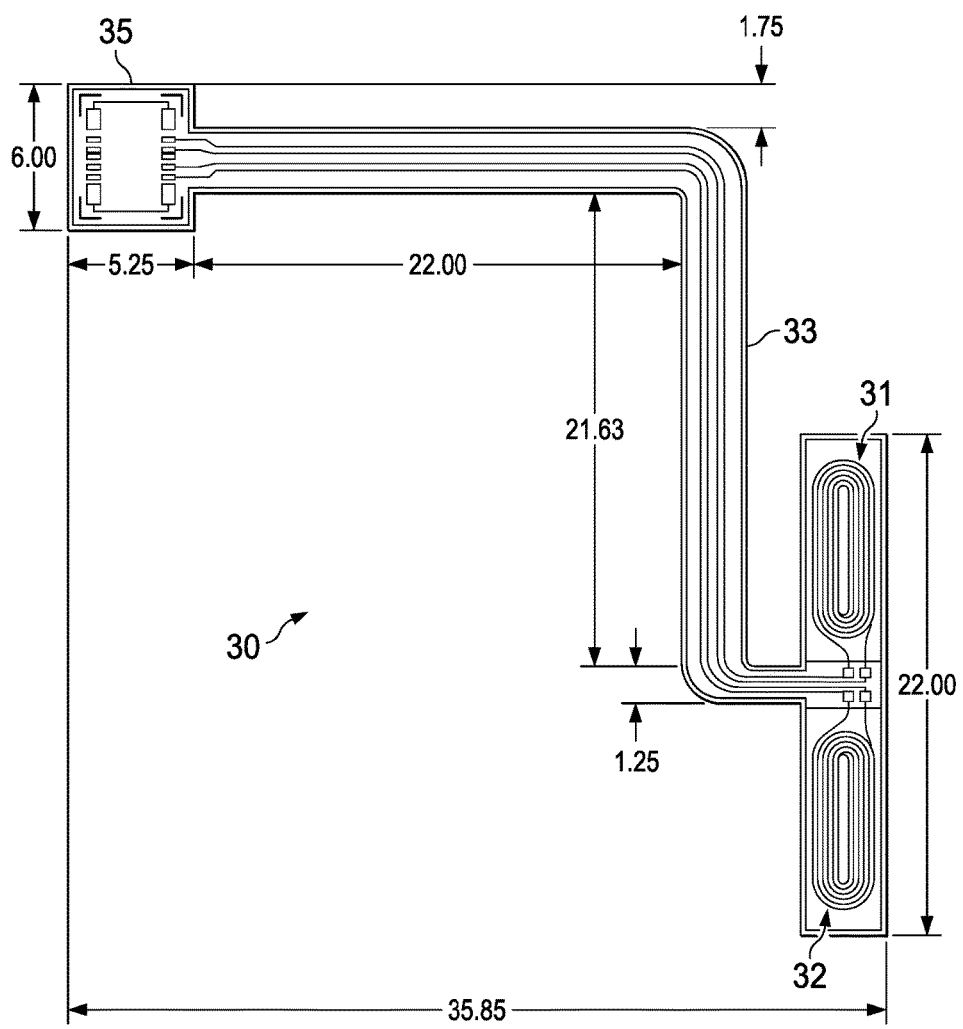
FIG. 5 illustrates an example touch sensor assembly [30], with dual sensor inductor coils [31, 32], such as for the dual touch button arrangement of FIGS. 1A/1B, 2A/2B, including a flexible flat (ribbon) cable [33] coupling the dual sensor inductor coils to sensor electronics [35].

FIG. 5 illustrates an example touch sensor assembly 30, with dual sensor inductor coils 31, 32, such as for the dual touch button arrangement of FIGS. 1A/1B, 2A/2. The example touch sensor assembly is fabricated with a flexible flat (ribbon) cable 33 coupling the dual sensor inductor coils to sensor electronics 35.

For the example implementation based on inductive sensing, the sensor electronics can be designed to provide excitation current drive to the sensor inductor coil (creating a projected time varying magnetic sensing field), and to measure a sensor inductor coil characteristic (such as inductance or Q-factor) indicative of the position of the touch button surface (conductive target) relative to the sensor inductor coil, including deflection of the touch button surface toward the sensor inductor coil in response to a button-press condition.

When the touch button apparatus is assembled, the touch sensor assembly is inserted within the touch sensor slot, and secured by the touch sensor spring clip in position relative to the touch button surface for touch sensing. The touch sensor spring clip exerts a force on the back of the touch sensor assembly, pressing it against the internal wall of the touch button surface. As illustrated in FIGS. 4A/4B, the example touch sensor assembly includes front-face spacers that maintain a sensing gap/spacing between the touch sensor (the sensor inductor coil for the example inductive sensing implementation), and the touch button surface.

Detection of a touch button-press event/condition can be based on any sensing technology capable of detecting deformation of the touch button surface/structure for the particular application and device design. Examples are inductive and capacitive sensing technologies, using respective sensor configurations and electronics. Implementations of touch deformation sensing technology are not part of this Disclosure, and are not described in detail. For example, inductive sensing can be based on detecting button-press deformation of a touch surface/structure, configured as a conductive target, toward a spaced coil inductor, causing a change in coil inductance (i.e., a change in the projected magnetic field of the coil inductor driven by the sensor electronics). And, capacitive sensing can be based on detecting button-press deformation of a touch surface/structure toward a capacitive electrode, causing a change in projected electric field detected as a change in capacitance.

The examples of the touch button apparatus use inductive sensing technology, in which the touch sensor assembly includes a sensor inductor coil (coupled to associated sensor electronics) to inductively sense touch button-press deformation/deflection of the touch button surface (conductive target).

In summary, an apparatus according to the Disclosure can be used in a device (such as a mobile communication device)

with one or more touch buttons each defined on a touch button surface of the device. The apparatus can include a touch sensor slot, and a touch sensor spring clip for securing a touch sensor assembly within the touch sensor slot. The touch sensor assembly can include a touch sensor portion (such as a sense inductor coil). The touch sensor slot can form a part of the device case interior, at a back-side of the touch button surface, which forms a front-side surface of the touch sensor slot, and can be configured to position the touch sensor portion of the touch sensor assembly relative to the associated touch button. The touch sensor spring clip can be inserted within the touch sensor slot to flexibly urge the touch sensor portion toward the front-side surface of the touch sensor slot.

The touch sensor assembly can include front-side spacers disposed at a front-side surface of the touch sensor portion, with the touch sensor spring clip securing the touch sensor portion of the touch sensor assembly within the touch sensor slot by exerting a force to urge the touch sensor portion against the touch button surface at the front-side surface of the touch sensor slot, with the front-side spacers maintaining a sensing gap between the touch sensor portion and the touch button surface. The touch sensor assembly includes a sensor stiffener attached to the back-side surface of the touch sensor portion of the touch sensor assembly. with the touch sensor spring clip contacting the sensor stiffener. The touch sensor assembly can be constructed as a flex circuit printed circuit board (PCB) assembly including: a flex coil inductor PCB forming the touch sensor portion of the touch sensor assembly; a flex sensor electronics PCB; and a flex ribbon cable connecting the flex coil inductor PCB to the flex sensor electronics PCB.

The Disclosure provided by this Description and the Figures sets forth examples and applications illustrating aspects and features of the invention, and does not limit the scope of the invention, which is defined by the claims. Known circuits, connections, functions and operations are not described in detail to avoid obscuring the principles and features of the invention. These examples and applications, can be used by ordinarily skilled artisans as a basis for modifications, substitutions and alternatives to construct other embodiments, including adaptations for other applications.

The invention claimed is:

1. An apparatus for use in a device with one or more touch buttons each disposed at a touch button area of the device with an exterior touch button surface and an interior-side of the touch button area opposite the touch button surface, the apparatus comprising:
a touch sensor assembly including a flex circuit printed circuit board (PCB) assembly, including:
a touch sensor PCB including a flex coil inductor PCB forming a touch sensor portion of the touch sensor assembly,
a flex sensor electronics PCB, and
a flex ribbon cable connecting the flex coil inductor PCB to the flex sensor electronics PCB;
a touch sensor slot disposed at the interior-side of the touch button area, the interior-side of the touch button area forming a front-side surface of the touch sensor slot;
the touch sensor slot configured to position the touch sensor portion of the touch sensor assembly relative to the associated touch button area; and
a touch sensor spring clip insertable within the touch sensor slot to flexibly urge the touch sensor portion toward the front-side surface of the touch sensor slot.

2. The apparatus of claim 1, wherein
the touch sensor assembly includes front-side spacers disposed at a front-side surface of the touch sensor portion; and
the touch sensor spring clip securing the touch sensor portion of the touch sensor assembly within the touch sensor slot by exerting a force to urge the touch sensor portion against the interior-side of the touch button area, with the front-side spacers maintaining a sensing gap between the touch sensor portion and the interior-side of the touch button area.

3. The apparatus of claim 2, wherein
the touch sensor assembly includes a sensor stiffener attached to a back-side surface of the touch sensor portion of the touch sensor assembly;
the touch sensor spring clip contacting the sensor stiffener.

4. The apparatus of claim 1, wherein the device is a mobile communication device.

5. The apparatus of claim 1, wherein the touch button area is incorporated into a side-wall portion of the device.

6. A device with one or more touch buttons, comprising:
a case, including a touch button area with an exterior touch button surface and an interior-side of the touch button area opposite the touch button surface, and including a touch sensor slot disposed at the interior-side of the touch button area, the interior-side of the touch button area forming a front-side surface of the touch sensor slot; and
a touch sensor assembly including a flex circuit printed circuit board (PCB) assembly, including:
a touch sensor PCB including a flex coil inductor PCB forming a touch sensor portion of the touch sensor assembly,
a flex sensor electronics PCB, and
a flex ribbon cable connecting the flex coil inductor PCB to the flex sensor electronics PCB;
the touch sensor slot configured to position the touch sensor portion of the touch sensor assembly relative to the associated touch button area; and
a touch sensor spring clip inserted within the touch sensor slot to flexibly urge the touch sensor portion toward the front-side surface of the touch sensor slot.

7. The device of claim 6, wherein
the touch sensor assembly includes front-side spacers disposed at a front-side surface of the touch sensor portion; and
the touch sensor spring clip securing the touch sensor portion of the touch sensor assembly within the touch sensor slot by exerting a force to urge the touch sensor portion against the interior-side of the touch button area, with the front-side spacers maintaining a sensing gap between the touch sensor portion and the interior-side of the touch button area.

8. The device of claim 7, wherein
the touch sensor assembly includes a sensor stiffener attached to a back-side surface of the touch sensor portion of the touch sensor assembly;
the touch sensor spring clip contacting the sensor stiffener.

9. The device of claim 6, wherein the device is a mobile communication device.

10. The device of claim 1, wherein the touch button area is incorporated into a side-wall of the case.

11. A method of constructing a touch button for a device, the touch button disposed at a touch button area of the device with an exterior touch button surface and an interior-side of the touch button area opposite the touch button surface, the method comprising:
- configuring a touch sensor assembly as a flex circuit printed circuit board (PCB) assembly, including:
  - a touch sensor PCB including a flex coil inductor PCB forming a touch sensor portion of the touch sensor assembly,
  - a flex sensor electronics PCB, and
  - a flex ribbon cable connecting the flex coil inductor PCB to the flex sensor electronics PCB;
- forming in the device a touch sensor slot at the interior-side of the touch button area, the interior-side of the touch button area forming a front-side surface of the touch sensor slot, the touch sensor slot configured to position the touch sensor portion of the touch sensor assembly relative to the associated touch button area; and
- securing the touch sensor portion of the touch sensor assembly within the touch sensor slot with a touch sensor spring clip, inserted within the touch sensor slot to flexibly urge the touch sensor portion toward the front-side surface of the touch sensor slot.

12. The method of claim 11, wherein
configuring the touch sensor assembly includes configuring front-side spacers disposed at a front-side surface of the touch sensor portion;
the touch sensor portion of the touch sensor assembly secured within the touch sensor slot by the touch sensor spring clip exerting a force to urge the touch sensor portion against the interior-side of the touch button area, with the front-side spacers maintaining a sensing gap between the touch sensor portion and the interior-side of the touch button area.

13. The method of claim 12, wherein
configuring the touch sensor assembly includes configuring a sensor stiffener attached to a back-side surface of the touch sensor portion of the touch sensor assembly, with the touch sensor spring clip contacting the sensor stiffener.

14. The method of claim 11, wherein the device is a mobile communication device.

15. The method of claim 11, wherein the touch button area is incorporated into a side-wall portion of the device.

* * * * *